United States Patent [19]

Wakamiya

[11] 3,725,751

[45] Apr. 3, 1973

[54] SOLID STATE TARGET ELECTRODE FOR PICKUP TUBES

[75] Inventor: Kinji Wakamiya, Tokyo, Japan

[73] Assignee: Sony Corporation, Tokyo, Japan

[22] Filed: Jan. 20, 1970

[21] Appl. No.: 4,184

[30] Foreign Application Priority Data

Feb. 3, 1969 Japan ....................................44/8042

[52] U.S. Cl..........317/235 R, 317/235 N, 317/235 F, 317/235 AT, 148/175, 313/108 D

[51] Int. Cl.............................H01l 11/00, H01l 15/00

[58] Field of Search....317/234, 235, 27, 48.7, 22.11, 317/22, 22.1; 313/108 D; 148/175, 174

[56] References Cited

UNITED STATES PATENTS

| | | | |
|---|---|---|---|
| 3,372,063 | 3/1968 | Suzuki | 317/235 X |
| 3,428,850 | 2/1969 | Crowell et al. | 317/235 X |
| 3,432,792 | 3/1969 | Hatcher | 317/235 X |
| 3,471,754 | 10/1969 | Hoshi et al. | 317/235 |
| 3,475,661 | 10/1969 | Iwata et al. | 317/234 |

OTHER PUBLICATIONS

Camera Tube Uses Solid-State Target Electrode; Electronics World, May 1967 page 34.

*Primary Examiner*—John W. Huckert
*Assistant Examiner*—Andrew J. James
*Attorney*—Hill, Sherman, Meroni, Gross and Simpson

[57] ABSTRACT

A target using a diode array for pickup tubes which consists of a semiconductor substrate including on one surface thereof an array of regions, defining PN junctions with the major portion of the substrate formed from a vapor-deposited layer of the same conductivity type as the substrate and having a plurality of polycrystalline regions of low resistivity of conductivity type opposite to the substrate.

6 Claims, 18 Drawing Figures

INVENTOR.
KINJI WAKAMIYA

BY Hill, Sherman, Meroni, Gross & Simpson
ATTORNEYS

INVENTOR.
KINJI WAKAMIYA
BY Hill, Sherman, Meroni, Gross & Simpson ATTORNEYS

INVENTOR.

KINJI WAKAMIYA

BY Hill, Sherman, Meroni, Gross & Simpson ATTORNEYS

INVENTOR.

KINJI WAKAMIYA

BY Hill, Sherman, Meroni, Gross & Simpson ATTORNEYS

SOLID STATE TARGET ELECTRODE FOR PICKUP TUBES

BACKGROUND OF THE INVENTION

1. Field of the Invention

This invention relates to a target for pickup tubes, and more particularly to a semiconductor target made up of a plurality of diode arrays.

2. Description of the Prior Art

Vidicons have previously been widely used as pickup tubes. The vidicon target is a photoconductive layer formed by the vapor deposition of antimony trisulphide $Sb_2S_3$, lead monoxide PbO, or the like. However, the target formed of such a material is crystallographically unknown in many areas and it is difficult to obtain the desired characteristics. Prior targets have also had poor persistence. To avoid such drawbacks, a pickup tube has been proposed which employs a target constructed of an N-type semiconductor substrate having an array of isolated P-type regions forming junction diodes in the substrate. Pickup tubes of this type have a space charge region formed in the vicinity of the PN junction which must be located near the light-receiving area of the semiconductor substrate so as to provide enhanced photoelectric conversion efficiency and widened response. This problem may be overcome by minimizing the thickness of the semiconductor substrate, by deep impurity diffusion to form the PN junction in the vicinity of the light-receiving area or by selecting the resistivity of the substrate to be less than 100 ohm-cm. However, the first method causes a decrease in the mechanical strength of the target and hence introduces the possibility of breakage of the target during its manufacture or while the vidicon is in actual use. The substrate may be selectively removed by means of lapping, etching or the like after a diode array has been formed on the substrate but such removal is likely to introduce non-uniformity in the thickness of the substrate and mechanical stresses in the PN junction which cause the performance to deteriorate. The second method requires a long time for the impurity diffusion to lower the productivity and the impurity diffusion in a lateral direction imposes a limitation on the number of the junction diodes that can be constructed and this causes a decrease in resolution. Further, since the impurity diffusion takes place for a long period of time, contamination of the junction diodes occurs due to the deterioration of a diffusion site as of silicon dioxide which results in the lowering of performance. The third method is likely to form a channel in the surface of the substrate to produce a leakage current between the PN junctions to decrease the rectifying characteristic and hence results in poor performance.

SUMMARY OF THE INVENTION

In accordance with the present invention a vapor deposition layer is formed to increase its mechanical strength on a thin semiconductor substrate having formed thereon junction diodes and an electron beam is caused to scan polycrystalline regions of low resistivity formed on the vapor deposition layer to thereby eliminate the drawbacks experienced in the prior art listed above.

Accordingly, one object of this invention is to provide a target for pickup tubes which has high resolution and excellent photoelectric conversion efficiency.

Another object of this invention is to provide a target for pickup tubes which is strong mechanically and easy to manufacture.

Other objects, features and advantages of this invention will become apparent from the following description taken in conjunction with the accompanying drawings.

DESCRIPTION OF THE PREFERRED EMBODIMENTS

Figure 1:
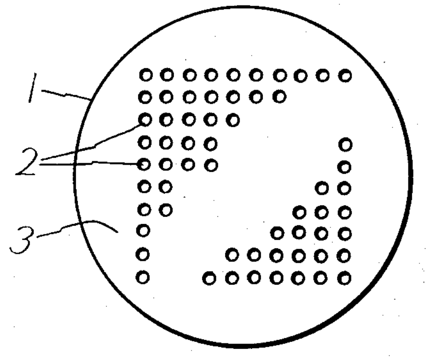
Fig-1 PRIOR ART
FIG. 1 is a schematic plan view of a conventional pickup tube target, for explaining this invention.
Figure 2:
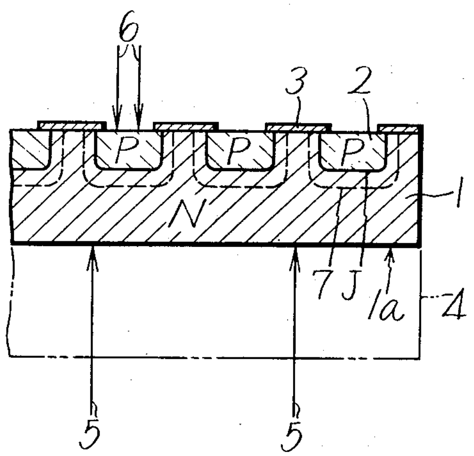
Fig-2 PRIOR ART
FIG. 2 is a cross-sectional view of the target depicted in FIG. 1.

In FIGS. 1 and 2 there is illustrated a conventional silicon target, in which reference numeral 1 indicates a semiconductor substrate, for example, an N-type silicon substrate and P-type islands 2 arrayed as shown. Reference numeral 3 designates an oxide layer, for example, a silicon dioxide layer coated on the entire area of the target which is selectively removed to expose one portion of each island and protects the other portions. As shown in FIG. 2 such a target is assembled with a faceplate 4 of a pickup tube by putting the face 1*a* of the substrate 1 on the opposite side from the islands 2 on the inner face of the faceplate 4 with or without a Nesa film. Light 5 from an object to be televised passes through an optical system and strikes the face 1*a* of the semiconductor substrate 1. The semiconductor substrate 1 is made positive and the islands 2 are sequentially scanned by an electron beam 6. The backward impedance of a diode portion of each PN junction J formed therein varies with the intensity of the light received by the face 1*a* of the substrate and converts light signals from an object into an electric signal for television transmission.

In order to raise the photoelectric conversion efficiency and widen the response of the target of such a target, it is necessary that a space charge region 7 formed near the PN junction J be positioned as close to the light receiving face of the target or the face 1*a* of the silicon substrate 1 as possible.

The present invention has increased the photoelectric conversion efficiency in the following manner.

Figures 3A, 3B, 3C, 3D, 3E:
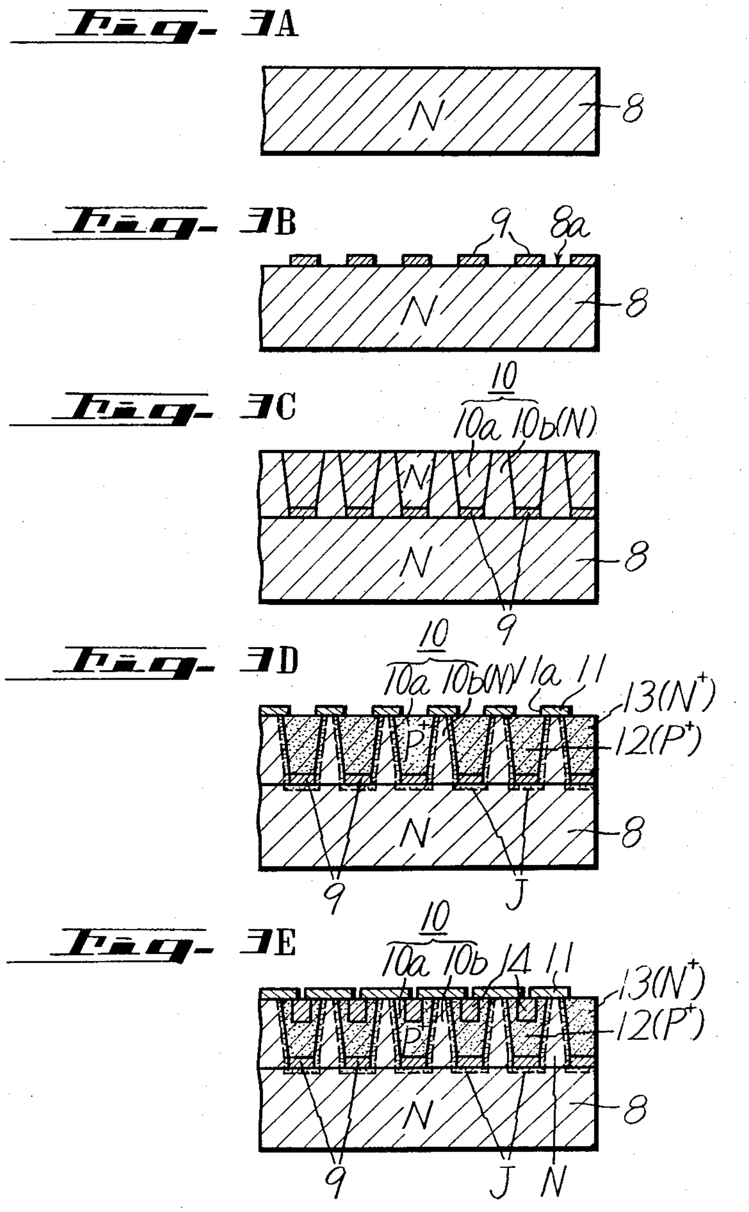
FIGS. 3A to 3E schematically illustrate a sequence of steps involved in the manufacture of a pickup tube target in accordance with this invention.

An N-type semiconductor substrate 8 such as shown in FIG. 3A is formed of, for example, silicon and has a thickness of, for instance, approximately 50 microns. On one surface 8a of the semiconductor substrate 8, there is formed by selective vapor deposition of, for example, silicon, a plurality of circular amorphous seeding site layers 9 for the vapor growth of polycrystalline regions in accordance with the size and arrangement of islands which will be ultimately formed, as illustrated in FIG. 3B. Since the polycrystalline regions formed on the layers 9 tend to increase their diameters or widths as they grow, this fact must be taken into account in the selection of the size of the seeding site layers 9. The seeding site layers 9 may be formed of silicon dioxide.

The next step consists in the formation of an N-type semiconductor layer 10 having a thickness of, for example, about 20 microns on the surface 8*a* of the semiconductor substrate 8 by means of vapor growth at a suitable temperature of approximately 1,200°C. as shown in FIG. 3C. In this vapor growth process a vapor of, for example, monosilane $SiCl_4$ mixed with a hydrogen $H_2$ gas is passed over the semiconductor substrate 8 to form thereon a semiconductor layer 10. The resulting layer 10 consists of polycrystalline regions 10*a* on the seeding site layers 9 and single crystal regions 10*b* on the surface 8*a* of the substrate 8 at those areas where the layers 9 do not lie.

Then, an insulating oxide material layer 11 as of silicon dioxide is formed on the upper surface of the semiconductor layer 10 in such a manner that the layer 11 has, for example, circular windows 11*a* on the polycrystalline regions 10*a*, as depicted in FIG. 3D. Then, a P-type impurity is diffused at high concentration through the windows 11*a* of the oxide material layer 11 into the polycrystalline regions 10*a* to form therein P-type regions 12. In this case the P-type impurity is diffused through the polycrystalline regions 10*a* partly into the single crystal regions 10*b* and the semiconductor substrate 8 adjoining the polycrystalline regions 10*a*, thus forming PN junctions J. An N-type impurity is diffused into at least one of the polycrystalline regions at high concentration to provide an N-type region, that is, an electrode 13 for external connection of the semiconductor substrate 8 and the single crystal regions 10*b*. Thus, a target made up of diode arrays such as shown in FIG. 3D is produced and the target is mounted on the faceplate of the vidicon. After the manufacturing processes have been completed, the semiconductor substrate 8 may be removed slightly by lapping or the like from the light-receiving face so as to obtain a predetermined thickness of the target. The semiconductor substrate 8 may, if desired, be removed only at the central area where the diodes are formed, that is, mainly at the light-receiving area so as to maintain the mechanical strength of the target. Care should be taken to prevent non-uniformity of the thickness of the target and unwanted stresses to the PN junctions when the thickness or amount of the substrate removed is great.

It is also possible to produce a target consisting of many transistors such as depicted in FIG. 3E in which N-type regions 14 of high impurity concentration are formed in the P-type regions 12.

FIG. 4 illustrates another embodiment of this invention in which parts corresponding to those in FIG. 3 are identified by the same reference numerals and the description of the steps for forming elements common with FIG. 3 will not be repeated.

Figures 4A, 4B, 4C, 4D, 4E:
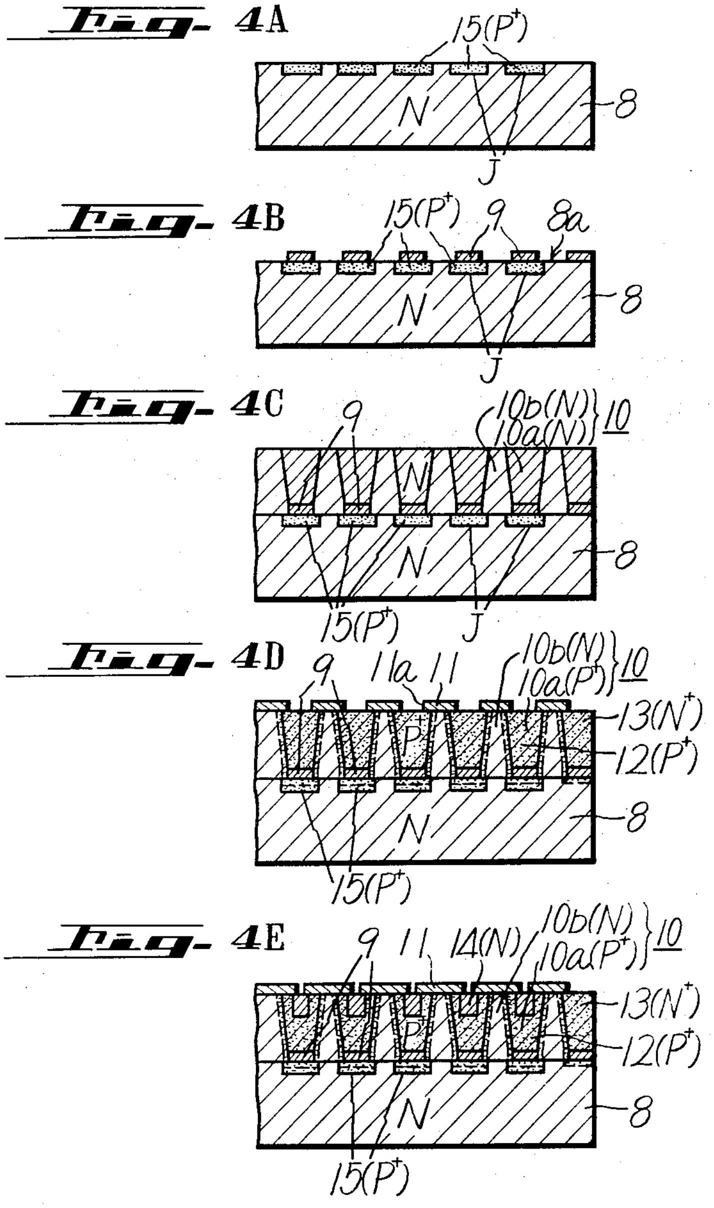
FIGS. 4A to 4E and 5A to 5F schematically show steps in modified forms of this invention.

In FIG. 4, the first step consists in the preparation of a semiconductor substrate 8 such as depicted in FIG. 4A which is similar to that in the example of FIG. 3. A P-type impurity is selectively diffused into the substrate 8 from its one surface 8*a* at high concentration in accordance with the size and arrangement of islands which will be ultimately formed, thereby forming shallow P-type islands (buried layers) 15 in the semiconductor substrate 8. Thus, PN junctions are formed in advance.

Then, amorphous seeding site layers 9 of, for example, circular configuration are respectively formed by selective vapor deposition of, for example, silicon on the surface 8*a* of the substrate at those areas overlying the P-type islands 15. The processes (of FIGS. 4C and 4D or 4C, 4D and 4E) after this are the same as those shown in FIGS. 3C, 3D and 3E, and the description will not be repeated. However, at least one polycrystalline region 10*a* is formed on the area where the islands 15 do not lie, so as to provide an electrode 13 for external connection of the N-type region. In the example of FIG. 4 the islands 15 are formed in close proximity to adjacent ones to provide for enhanced resolution. The area of each seeding site layer 9 is made smaller than that in the example of FIG. 3 and the thickness of the semiconductor layer 10 is selected to be in the range of 30 to 50 microns. The layer 10 is formed of such a thickness so as to prevent the polycrystalline regions 10*a* from joining with adjacent ones as they grow. In the present example the polycrystalline regions 10*a* with the P-type impurity diffused into them serve as electrodes for connecting the islands (buried layers) 15 with external circuits. FIG. 4E shows a target made up of transistor arrays and having the N regions 14 formed therein.

FIG. 5 illustrates a further example of this invention in which elements corresponding to those in FIG. 3 are marked with the same reference numerals and will not be described again.

Figures 5A, 5B, 5C, 5D, 5E, 5F:
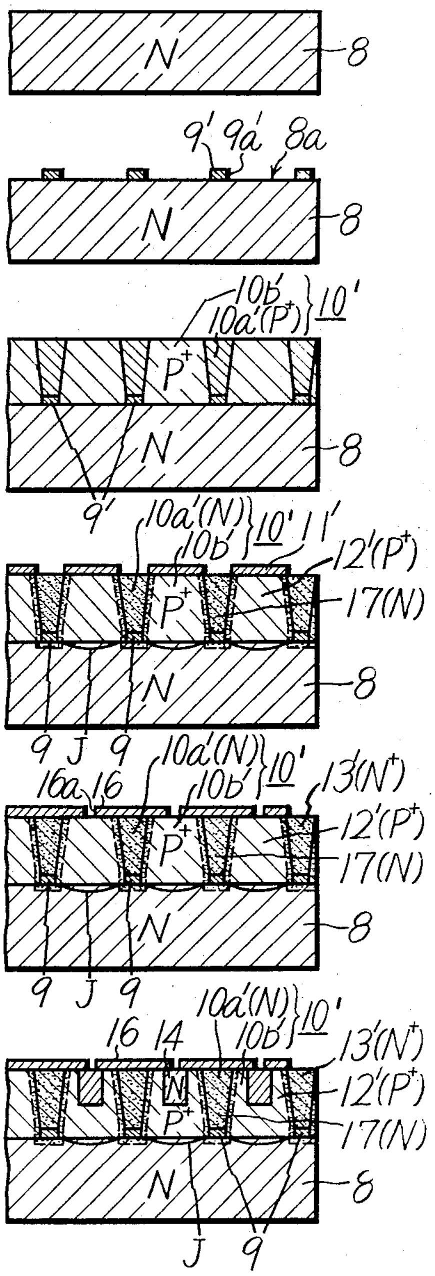

First an N-type semiconductor substrate 8 such as depicted in FIG. 5A, which is similar to that in the example of FIG. 3, is coated on surface 8*a* over its entire area by selective vapor deposition of, for example, silicon, with an amorphous seeding site layer 9' having many circular windows 9*a'* for the vapor growth of polycrystalline regions in accordance with the size and arrangement of islands which will be ultimately formed.

Then, a P-type high impurity concentration semiconductor layer 10' having a thickness of, for example, about 20 microns is formed by vapor deposition on the surface 8*a* of the semiconductor substrate 8 at a suitable temperature of approximately 1,200°C. as illustrated in FIG. 5C. The semiconductor layer 10' consists of polycrystalline regions 10*a'* grown on the seeding site layers 9' and single crystal regions 10*b'* formed on the circular areas of the surface 8*a* of the semiconductor substrate 8.

This is followed by the formation of, for example, circular insulating oxide material layers 11' on the upper surface of the semiconductor layer 10' to cover the single crystal regions 10*b'* as depicted in FIG. 5D. Then, an N-type impurity is diffused into the polycrystalline region 10*b'* through the oxide material layers 11' serving as targets, thus forming an N-type region 17. In this case the N-type impurity is diffused through the polycrystalline region 10*a'* partly into the single crystal regions 10*b'* and the semiconductor substrate 8 adjoining the region 10*a'* to form P-type islands 12' in the single crystal regions 10*b'*.

Next, the upper surface of the semiconductor layer 10' is covered over its entire area with an oxide material layer 16, after which the oxide material layer 16 is selectively etched away to form windows 16*a* on the P-type impurity regions 12' in the single crystal regions 10*b'* as depicted in FIG. 5E, thus producing a target made up of many diodes as shown. One portion of the N-type polycrystalline region 10$a'$ is not covered with the oxide material layer 16 and is converted to be an N-type region of high concentration, which is used as an electrode 13′ for external connection of the N-type region.

Also N-type islands 14 may be formed in the P-type regions 12′ to provide targets consisting of many transistors.

With this invention the polycrystalline region in which the impurity diffusion velocity is greater than that in the single crystal is formed simultaneously with the single crystal region and the impurity is diffused into the polycrystalline region. Even if the target is thick, the distance between the light-receiving face of the target and the space charge region formed near the PN junction can be shortened and the time for the impurity diffusion can also be shortened.

It will be apparent that many modifications and variations may be effected without departing from the scope of the novel concepts of this invention.

I claim as my invention:

1. A target electrode for pickup tubes comprising:
   a semiconductor substrate of one conductivity type;
   a plurality of islands of opposite conductivity type formed in said substrate from one surface thereof;
   a plurality of discrete seeding sites formed on said islands of opposite conductivity type;
   a vapor deposited layer formed on said one surface of said substrate over said seeding sites and having an array of polycrystalline regions over said seeding site areas and single crystal regions where said seeding site areas are not formed, all of the polycrystalline regions except one being of opposite conductivity type as that of the substrate and said one polycrystalline region being of the same conductivity type as that of the substrate; and
   an insulating layer formed over said vapor deposited area and having windows formed therein and over said polycrystalline region and said substrate receiving light energy on its second surface whereby the conversion efficiency and frequency response is improved.

2. A target electrode for pickup tubes comprising:
   a semiconductor substrate of one conductivity type;
   a plurality of seeding site areas formed on said substrate on one surface thereof;
   a vapor deposited layer formed on said one surface of said substrate and over said seeding sites and having an array of polycrystalline regions over said seeding site areas and single crystalline regions where said seeding site areas are not formed, the single crystalline regions being of the opposite conductivity type as that of the substrate; and
   an insulating layer formed over said vapor deposited area and having windows formed therein over said single crystal regions and said insulating layer not covering at least one of said polycrystalline regions and said one polycrystalline region being of the same conductivity type as that of the substrate and said substrate receiving light energy on its second surface whereby the conversion efficiency and frequency response is improved.

3. A target electrode for pickup tubes as claimed in claim 1 wherein said single crystal regions are of the same conductivity type as that of the semiconductor substrate.

4. A target electrode for pickup tubes as claimed in claim 1 wherein diffused regions of the same conductivity type as that of the semiconductor substrate are formed in the polycrystalline regions through said windows.

5. A semiconductivity target electrode according to claim 1 comprising regions of the one conductivity type formed in said polycrystalline regions through said windows.

6. A semiconductor target electrode according to claim 1 comprising regions of the one conductivity type formed through said windows in said single crystal regions.

* * * * *